(12) United States Patent
Lee

(10) Patent No.: US 10,563,837 B2
(45) Date of Patent: Feb. 18, 2020

(54) LAMP FOR VEHICLE AND LAMP ASSEMBLY FOR VEHICLE COMPRISING SAME

(71) Applicant: LG Innotek Co., Ltd., Seoul (KR)

(72) Inventor: Jung Ho Lee, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 185 days.

(21) Appl. No.: 15/540,931

(22) PCT Filed: Nov. 5, 2015

(86) PCT No.: PCT/KR2015/011823
§ 371 (c)(1),
(2) Date: Jun. 29, 2017

(87) PCT Pub. No.: WO2016/108417
PCT Pub. Date: Jul. 7, 2016

(65) Prior Publication Data
US 2017/0355304 A1 Dec. 14, 2017

(30) Foreign Application Priority Data

Dec. 29, 2014 (KR) .................. 10-2014-0192396

(51) Int. Cl.
F21S 43/00 (2018.01)
B60Q 3/51 (2017.01)
(Continued)

(52) U.S. Cl.
CPC .............. F21S 43/00 (2018.01); B60Q 3/51 (2017.02); B60Q 3/74 (2017.02); F21V 23/06 (2013.01); F21Y 2115/10 (2016.08)

(58) Field of Classification Search
CPC ................................ F21K 9/135; F21V 23/006
See application file for complete search history.

(56) References Cited

U.S. PATENT DOCUMENTS

2009/0073707 A1  3/2009 Nagai et al.
2010/0080014 A1  4/2010 Ichikawa
(Continued)

FOREIGN PATENT DOCUMENTS

EP   2 787 798 A2   10/2014
JP   S59-067886 U    5/1984
(Continued)

OTHER PUBLICATIONS

Supplementary European Search Report dated Jun. 15, 2018 in European Application No. 15875511.6.
(Continued)

Primary Examiner — Anh T Mai
Assistant Examiner — Zachary J Snyder
(74) Attorney, Agent, or Firm — Saliwanchik, Lloyd & Eisenschenk

(57) ABSTRACT

The present invention provides a lamp for a vehicle including a housing in which an open surface is formed, a first substrate on which a light source is mounted and which is disposed in the housing such that the light source faces the open surface, a second substrate electrically connected to the first substrate and perpendicularly coupled to the first substrate, a terminal part coupled to an end portion of the second substrate to be in contact with a terminal of a socket connected to an external power source, and a lens coupled to the housing to cover the open surface, and thus may provide an advantageous effect in that areas of a heat sink and the substrate are minimized while electrical connectivity is secured.

20 Claims, 7 Drawing Sheets

(51) Int. Cl.
*B60Q 3/74* (2017.01)
*F21V 23/06* (2006.01)
*F21Y 115/10* (2016.01)

(56) References Cited

U.S. PATENT DOCUMENTS

2013/0114251 A1   5/2013  Duan
2014/0369056 A1   12/2014 Kwon
2016/0146442 A1*  5/2016  Fong .................... H01R 12/714
                                                362/363

FOREIGN PATENT DOCUMENTS

| JP | 3151914 U | 7/2009 |
| JP | 2014-203823 A | 10/2014 |
| WO | WO-2012/111843 A1 | 8/2012 |
| WO | WO-2013/060510 A1 | 5/2013 |
| WO | WO-2013/102996 A1 | 7/2013 |

OTHER PUBLICATIONS

International Search Report in International Application No. PCT/KR2015/011823, filed Nov. 5, 2015.
Office Action dated Oct. 8, 2019 in Japanese Application No. 2017-535064.

\* cited by examiner

LAMP FOR VEHICLE AND LAMP ASSEMBLY FOR VEHICLE COMPRISING SAME

CROSS-REFERENCE TO RELATED APPLICATIONS

This application is the U.S. national stage application of International Patent Application No. PCT/KR2015/011823, filed Nov. 5, 2015, which claims priority to Korean Application No. 10-2014-0192396, filed Dec. 29, 2014, the disclosures of each of which are incorporated herein by reference in their entirety.

TECHNICAL FIELD

The present invention relates to a lamp for a vehicle and a lamp assembly for a vehicle including the same, and more particularly, to a lamp for a vehicle installed in an interior of a vehicle to illuminate an interior space of the vehicle and a lamp assembly for a vehicle including the same.

BACKGROUND ART

Among lamps for a vehicle, a room lamp is a lamp for illuminating an interior of a vehicle from the center of a ceiling of the interior of the vehicle or a place adjacent to a windshield. Such a room lamp is an essential part for securing visibility of a driver and a passenger in an interior of a vehicle.

Although a bulb type light source has conventionally been used as a light source of a room lamp, the light source has recently rapidly changed to a light emitting diode (LED).

Conventionally, a room lamp may be provided with an LED package, a substrate for mounting the LED package thereon, a lens, and the like, and may include a housing including the above components. Particularly, when a light source is an LED, a heat sink may be provided at the room lamp. When the fact that a room lamp is installed in an interior of a vehicle in which a spatial limitation is serious is considered, there are problems in that the room lamp is difficult to install in the interior of the vehicle and a process in which the room lamp is applied to the vehicle is complex when a structure of the room lamp is complex.

DISCLOSURE

Technical Problem

The present invention is directed to providing a lamp for a vehicle in which areas of a heat sink and a substrate can be minimized while electrical connectivity is secured and a lamp assembly for a vehicle including the same.

In addition, the present invention is also directed to providing a lamp for a vehicle having excellent assembling and coupling properties.

The scope of the present invention is not limited to the above-described objects, and other unmentioned objects may be clearly understood by those skilled in the art from the following descriptions.

Technical Solution

According to an aspect of the present invention, there is provide a lamp for a vehicle including a housing in which an open surface is formed, a first substrate on which a light source is mounted and which is disposed in the housing such that the light source faces the open surface, a second substrate electrically connected to the first substrate and perpendicularly coupled to the first substrate, a terminal part coupled to an end portion of the second substrate to be in contact with a terminal of a socket connected to an external power source, and a lens coupled to the housing to cover the open surface.

The first substrate may include slots for electrical connection formed at both side surfaces thereof, and the second substrate may include fins for electrical connection formed to extend from an upper end portion thereof to be inserted into the slots for electrical connection.

The terminal part may include a contact surface in contact with the terminal of the socket, guide surfaces formed to extend downward from both side surfaces of the contact surface, and a terminal piece having a body surface formed to extend from the contact surface.

The body surface may be formed on a flat surface which is different from the contact surface, and the body surface and the contact surface may be connected by an obliquely formed connecting surface.

The body surface may include a first body surface formed to extend from a rear surface of the contact surface and a second body surface formed to extend from a front surface of the contact surface.

The terminal part may include a first hooking surface formed to extend from an end portion of the first body surface and be bent downward to be inserted into a first hooking groove formed in an end portion of the second substrate.

The housing may include a terminal mounting part which is formed on a lower end portion thereof, and into which the terminal part is inserted such that the contact surface is exposed to the outside.

The terminal piece may include a second hooking surface formed to extend from an end portion of the second body surface and be bent downward, to be inserted into a second hooking groove formed in the terminal mounting part.

The terminal mounting part may include a first mounting surface in contact with an end of the guide surface and a second mounting surface formed to extend from a lower end of the first mounting surface and obliquely formed such that a thickness of the terminal mounting part increases in a downward direction.

The second hooking groove may be formed in a lower end of the second mounting surface.

Two terminal mounting parts identical to the terminal mounting part may be disposed in parallel.

Exposure directions of contact surfaces, which are identical to the contact surface, of the two terminal mounting parts may be different.

The exposure directions of the contact surfaces of the two terminal mounting parts may be opposite each other.

The terminal part may include two terminal pieces identical to the terminal piece coupled to the second substrate such that directions of contact surfaces identical to the contact surface are opposite each other.

The lens may include a hook.

At least two hooks identical to the hook may be symmetrically disposed with respect to a center of the lens.

The hook may be inserted into a hook groove formed in the housing.

According to another aspect of the present invention, there is provide a lamp assembly for a vehicle including a bracket, and a lamp for a vehicle including a housing having an open surface and coupled to the bracket, a first substrate having a light source mounted thereon and disposed in the housing such that the light source faces the open surface, a second substrate electrically connected to the first substrate and perpendicularly coupled to the first substrate, a terminal part coupled to an end portion of the second substrate to be in contact with a terminal of a socket connected to an external power source, and a lens coupled to the housing to cover the open surface.

A coupling hole through which the housing is coupled may be formed in the bracket.

Advantageous Effects

According to one embodiment of the present invention, since a second substrate perpendicularly coupled to a first substrate on which a light emitting diode (LED) is formed to be elongated is formed along a housing and the second substrate is provided with a terminal part coupled to a terminal of a socket at an end portion thereof, there is an advantageous effect in that areas of a heat sink and a substrate are minimized while electrical connectivity is secured.

In addition, according to one embodiment of the present invention, assembly is possible by only inserting a terminal part coupled to an end portion of a second substrate into a socket, and there is an advantageous effect in that a coupling property between the terminal part and the socket is improved due to elasticity of a contact surface and a body surface connected by an obliquely formed connecting surface.

MODES OF THE INVENTION

Hereinafter, exemplary embodiments of the present invention will be described in detail with reference to the accompanying drawings. Purposes, specific advantages, and novel features of the present invention will be made clear from exemplary embodiments and the following detailed description in connection with the accompanying drawings. Terms and words used in this specification and claims thereof are not to be interpreted as limited to commonly used meanings or meanings in dictionaries, and should be interpreted as having meanings and concepts which are consistent with the technological scope of the present invention based on the principle that the inventors have appropriately defined concepts of terms in order to describe the present invention in the best way. In the description of the present invention, when it is determined that detailed descriptions of related well-known functions unnecessarily obscure the gist of the present invention, the detailed descriptions will be omitted.

It should be understood that, although the terms including an ordinal number such as second, first, and the like may be used herein in reference to elements of the present invention, such elements are not to be construed as limited by these terms. These terms are only used to distinguish one element from another. For example, a second element could be termed a first element, and a first element could be termed a second element, without departing from the scope of the present invention.

Figure 1:
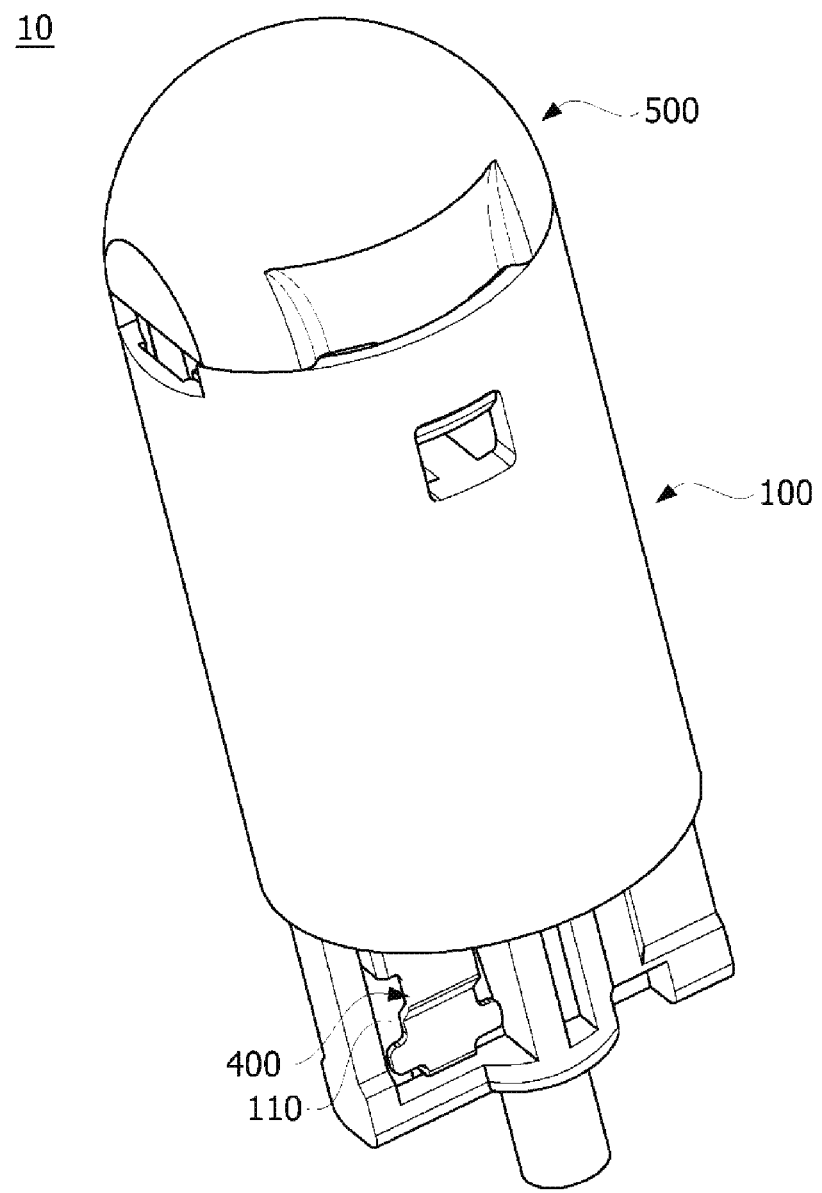
FIG. 1 is a view illustrating a lamp for a vehicle according to one exemplary embodiment of the present invention.
Figure 2:
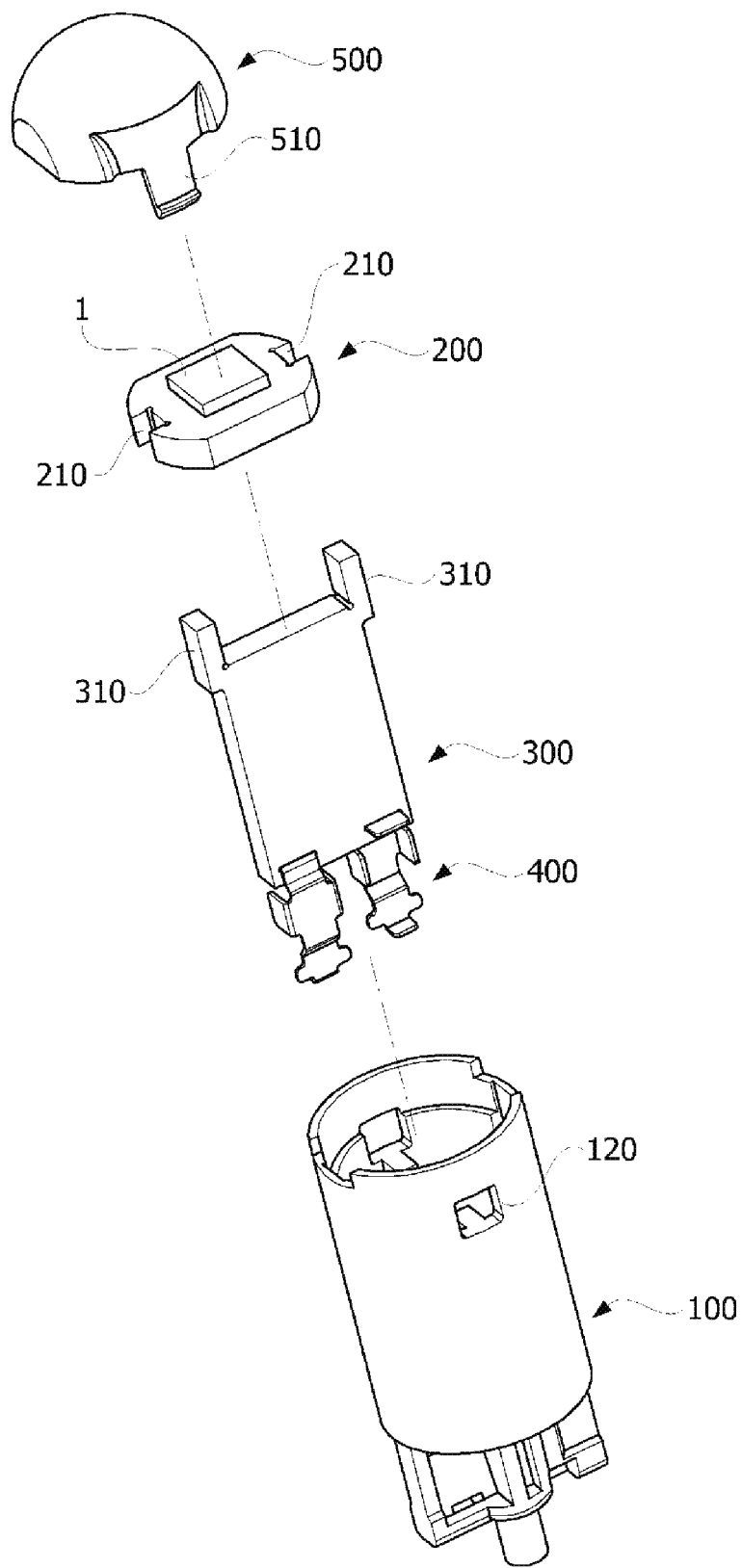
FIG. 2 is an exploded view of the lamp for a vehicle illustrated in FIG. 1.

FIG. 1 is a view illustrating a lamp for a vehicle according to one exemplary embodiment of the present invention, and FIG. 2 is an exploded view of the lamp for a vehicle illustrated in FIG. 1. FIGS. 1 and 2 are the views clearly illustrating main features for a clear conceptual understanding of the present invention, and thus various modifications are expected and the scope of the present invention is not limited to specific shapes illustrated in the drawings.

Referring to FIG. 1 and FIG. 2, a lamp 10 for a vehicle according to one exemplary embodiment of the present invention may include a housing 100, a first substrate 200, a second substrate 300, terminal parts 400, and a lens 500.

First, an upper end of the housing 100 is formed as an open surface, and terminal mounting parts 110 may be formed on a lower end of the housing 100. The housing 100 may be formed to be elongated in a cylindrical shape, and hook grooves 120 may be formed in an upper circumferential surface thereof.

Figure 3:
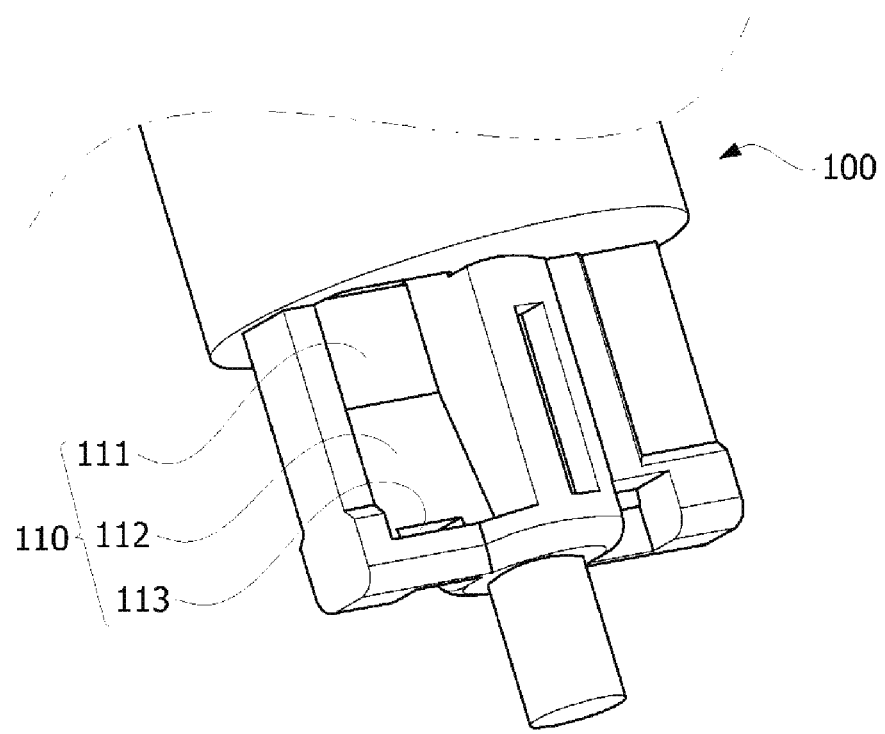
FIG. 3 is a view illustrating terminal mounting parts of a housing.

FIG. 3 is a view illustrating terminal mounting parts of a housing.

Referring to FIG. 3, each of the terminal mounting parts 110 may include a first mounting surface 111 and a second mounting surface 112. The first mounting surface 111 may be formed as a flat surface, and the second mounting surface 112 may be formed to extend from a lower end of the first mounting surface 111. In addition, the second mounting surface 112 may be obliquely formed so that a thickness of the terminal mounting part 110 increases in a downward direction. A second hooking groove 113 may be formed in a lower end of the second mounting surface 112. Two terminal mounting parts 110 may be disposed side by side in parallel on the lower end of the housing 100, or the two terminal mounting parts 110 may be disposed in different directions so that exposure directions of contact surfaces 410 (see FIG. 4) are opposite to each other.

Referring to FIG. 2, a light emitting diode (LED), which is a light source, may be mounted on the first substrate 200. An emitting surface of the LED mounted on the first substrate 200 may be disposed to face the open surface of the housing 100. In addition, slots 210 for electrical connection may be concavely formed in both side surfaces of the first substrate 200. Fins 310 for electrical connection of the second substrate 300 are inserted into the slots 210 for electrical connection.

The second substrate 300 may be perpendicularly coupled to the first substrate 200. The fins 310 for electrical connection may be formed on both side surfaces of an upper end of the second substrate 300. The fins 310 for electrical connection are inserted into the slots 210 for electrical connection to electrically connect the first substrate 200 and the second substrate 300.

Figure 4:
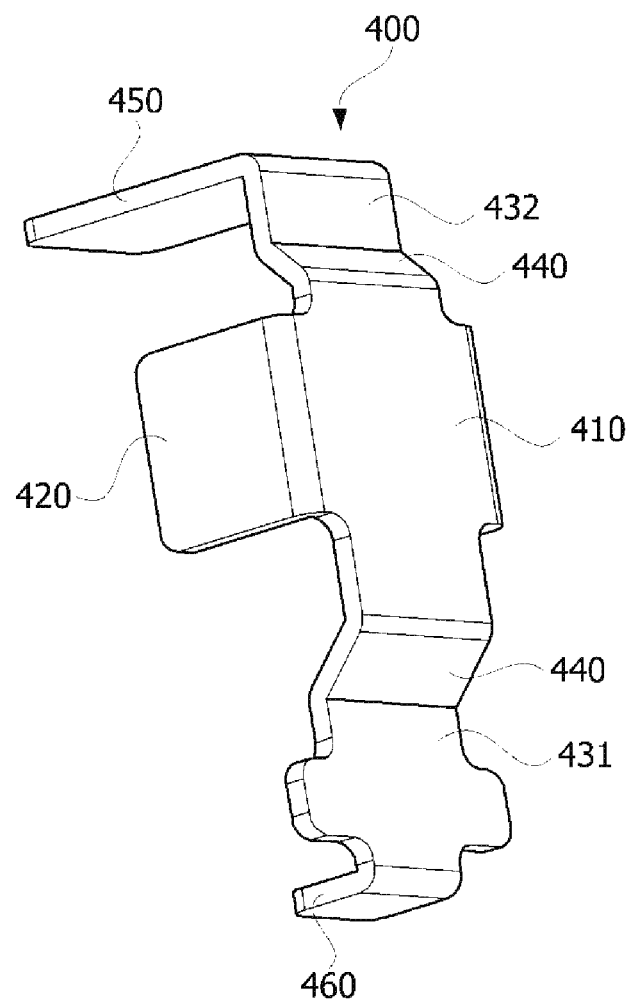
FIG. 4 is a view illustrating a terminal part.

FIG. 4 is a view illustrating a terminal part.

The terminal part 400 is in contact with a terminal of a socket (not shown) connected to an external power source and serves to electrically connect the socket and the second substrate 300. The terminal part 400 may include a terminal piece including the contact surface 410, guide surfaces 420, a body surface 430, connecting surfaces 440, a first hooking surface 450, and a second hooking surface 460.

First, the contact surface 410 is a portion in direct contact with a terminal of the socket. The guide surfaces 420 may be formed to extend from both sides of the contact surface 410 and be bent downward. The guide surfaces 420 may be formed as a quadrangular slice. Such guide surfaces 420 serve to support the body surface 430 so that the body surface 430 does not sway from side to side when the terminal part 400 is mounted on the terminal mounting part 110. The body surface 430 may include a first body surface 431 disposed at a rear surface of the contact surface 410 and a second body surface 432 disposed at a front surface of the contact surface 410.

The first body surface 431 and the second body surface 432 may be formed below the contact surface 410. In addition, the first body surface 431 and the second body surface 432 may be connected to the contact surface 410 through the connecting surfaces 440, which are obliquely formed.

The first hooking surface 450 may be formed to extend from an end portion of the second body surface 432 and be bent downward. In addition, the second hooking surface 460 may be formed to extend from an end portion of the first body surface 431 and be bent downward.

The contact surface 410, the guide surface 420, the body surface 430, the connecting surface 440, the first hooking surface 450, and the second hooking surface 460 may be separately described only according to shapes and functional features thereof, and may be vertically connected as one terminal piece.

Figure 5:
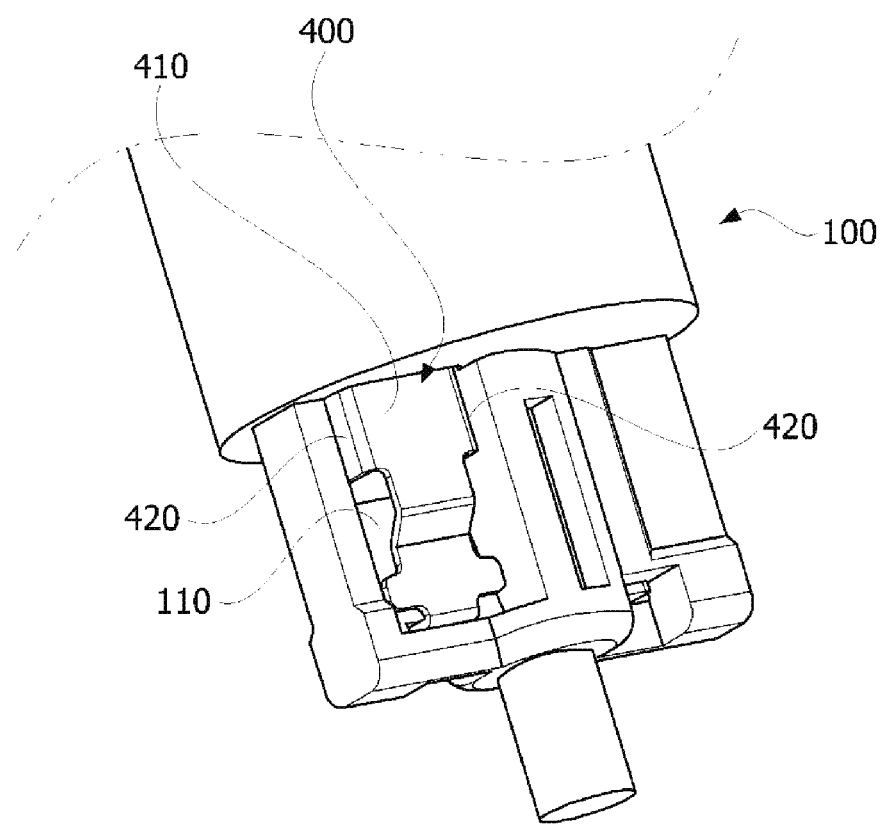
FIG. 5 is a view illustrating a terminal part that is mounted on a terminal mounting part of a housing.
Figure 6:
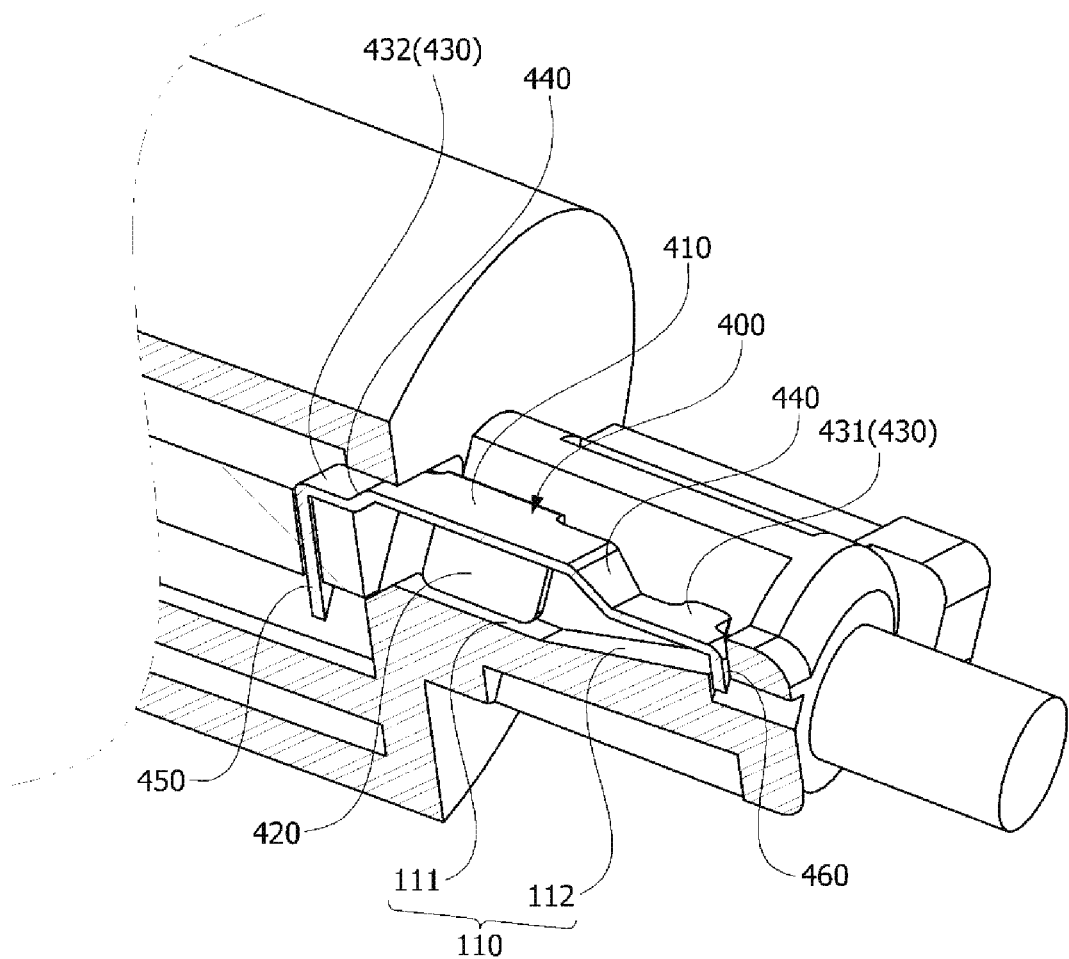
FIG. 6 is a cross-sectional view illustrating a terminal mounting part on which a terminal part is mounted.

FIG. 5 is a view illustrating a terminal part that is mounted on a terminal mounting part of a housing, and FIG. 6 is a cross-sectional view illustrating a terminal mounting part on which a terminal part is mounted.

Referring to FIG. 5 and FIG. 6, the terminal part 400 including two terminal pieces may be mounted on each of the terminal mounting parts 110 disposed in parallel.

The terminal part 400 is mounted on the terminal mounting part 110 such that the contact surface 410 is exposed to the outside. The guide surfaces 420 support side surfaces of the terminal mounting part 110 to induce the terminal part 400 to be structurally stable and not sway during insertion of the socket. A lower end of the guide surface 420 may be formed to be in contact with the first mounting surface 111.

The first hooking surface 450 may be inserted into and coupled to an end portion of the second substrate 300. An end portion of the first hooking surface 450 which protrudes upward from the second substrate 300 may be coupled and fused to the second substrate 300 in a state in which the first hooking surface 450 is inserted into the end portion of the second substrate 300.

At this time, the terminal part 400 may include two terminal pieces coupled to the end portion of the second substrate 300 such that the exposure directions of the contact surfaces 410 of the two terminal pieces are opposite each other. However, the present invention is not limited thereto, and the terminal part 400 may include a single terminal piece or a plurality of terminal pieces according to a structure of the socket.

When the terminal part 400 is mounted on the terminal mounting part 110, the second hooking surface 460 moves along the oblique second hooking surface 460 and is inserted into and hooked in the second hooking groove 113 formed in the terminal mounting part 110.

The lens 500 may include a pair of hooks 510. The hooks 510 may be symmetrically formed with respect to the lens 500. The hooks 510 are engaged with the hook grooves 120 formed in the housing 100 to couple the lens 500 to the housing 100.

Figure 7:
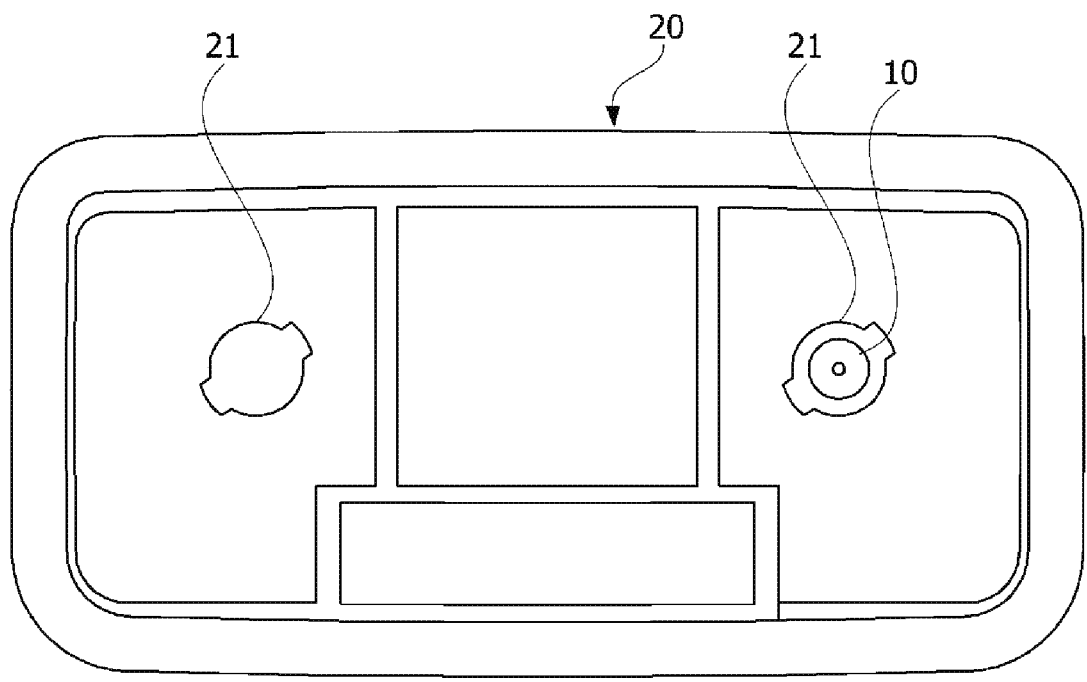
FIG. 7 is a view illustrating a bracket.

FIG. 7 is a view illustrating a bracket.

Referring to FIG. 7, the lamp assembly for a vehicle may include a bracket 20 in which lamps 10 for a vehicle are installed. The bracket 20 may be installed at a ceiling or a sidewall of an interior of a vehicle. Coupling holes 21 may be provided in the bracket 20, and a lower end portion of the housing 100 (see FIG. 1) of each of the lamps 10 for a vehicle may be inserted into and coupled to each of the coupling holes 21. A lens configured to diffuse or scatter light emitted from the lamps 10 for a vehicle may be installed in the bracket 20.

The lamp for a vehicle and the lamp assembly for a vehicle according to the exemplary embodiment of the present invention have been specifically described above with reference to the accompanying drawings.

While the present invention has been particularly described with reference to exemplary embodiments, those skilled in the art should understand that various changes in form and details may be made without departing from the spirit and scope of the present invention. Therefore, the exemplary embodiments should be considered in a descriptive sense only and not for purposes of limitation. The scope of the present invention is defined not by the detailed description of the present invention but by the appended claims, and encompasses all modifications and equivalents that fall within the scope of the appended claims.

REFERENCE NUMERALS

| | |
|---|---|
| 10: LAMP FOR A VEHICLE | 20: BRACKET |
| 100: HOUSING | 110: TERMINAL MOUNTING PART |
| 111: FIRST MOUNTING SURFACE | 112: SECOND MOUNTING SURFACE |
| 113: FIRST HOOKING GROOVE | 120: HOOK GROOVE |
| 200: FIRST SUBSTRATE | |
| 210: SLOT FOR ELECTRICAL CONNECTION | |
| 300: SECOND SUBSTRATE | |
| 310: FIN FOR ELECTRICAL CONNECTION | |
| 400: TERMINAL PART | 410: CONTACT SURFACE |
| 420: GUIDE SURFACE | 430: BODY SURFACE |
| 431: FIRST BODY SURFACE | 432: SECOND BODY SURFACE |
| 440: CONNECTING SURFACE | 450: FIRST HOOKING SURFACE |
| 460: SECOND HOOKING SURFACE | 500: LENS |

The invention claimed is:

1. A lamp for a vehicle, comprising:
   a housing in which an open surface is formed;
   a first substrate and a second substrate that are electrically connected;
   a light source mounted on the first substrate and that is disposed in the housing such that the light source faces the open surface;
   a terminal part coupled to an end portion of the second substrate to be in contact with a terminal of a socket connected to an external power source; and
   a lens coupled to the housing to cover the open surface,
   wherein the first substrate includes slots for electrical connection and the second substrate includes fins for electrical connection,
   wherein the second substrate is electrically connected to the first substrate and perpendicularly coupled to the first substrate as the slots are connected to the fins, wherein the slots for electrical connection are disposed on an outer edge of the first substrate, wherein the terminal part includes a contact surface in contact with the terminal of the socket, wherein the housing includes a terminal mounting part disposed on a lower end portion thereof, and into which the terminal part is inserted such that the contact surface is exposed to the outside, and wherein the terminal mounting part includes:
- a first mounting surface that is formed as a flat surface; and
- a second mounting surface formed to extend from a lower end of the first mounting surface, and obliquely formed such that a thickness of the terminal mounting part increases in a downward direction.

2. The lamp of claim 1, wherein the fins for electrical connection extend from an upper end portion of the second substrate.

3. The lamp of claim 1, wherein the terminal part includes:
- guide surfaces that extend downward from both side surfaces of the contact surface; and
- a terminal piece having a body surface that extends from the contact surface.

4. The lamp of claim 3, wherein:
- the body surface is disposed on a flat surface that is different from the contact surface; and
- the body surface and the contact surface are connected by an inclined connecting surface.

5. The lamp of claim 4, wherein the body surface includes:
- a first body surface that extends from a rear surface of the contact surface; and
- a second body surface that extends from a front surface of the contact surface.

6. A lamp for a vehicle, comprising:
a housing in which an open surface is formed;
a first substrate and a second substrate that are electrically connected;
a light source mounted on the first substrate and that is disposed in the housing such that the light source faces the open surface;
a terminal part coupled to an end portion of the second substrate to be in contact with a terminal of a socket connected to an external power source; and
a lens coupled to the housing to cover the open surface,
wherein the first substrate includes slots for electrical connection and the second substrate includes fins for electrical connection,
wherein the second substrate is electrically connected to the first substrate and perpendicularly coupled to the first substrate as the slots are connected to the fins,
wherein the terminal part includes:
- a contact surface in contact with the terminal of the socket;
- guide surfaces that extend downward from both side surfaces of the contact surface; and
- a terminal piece having a body surface that extends from the contact surface, wherein the body surface is disposed on a flat surface that is different from the contact surface, wherein the body surface and the contact surface are connected by an inclined connecting surface, wherein the body surface includes:
- a first body surface that extends from a rear surface of the contact surface; and
- a second body surface that extends from a front surface of the contact surface, and wherein the terminal part includes a first hooking surface disposed to extend from an end portion of the first body surface and be bent downward to be inserted into a first hooking groove disposed in an end portion of the second substrate.

7. The lamp of claim 6, wherein the housing includes a terminal mounting part that is disposed on a lower end portion thereof, and into which the terminal part is inserted such that the contact surface is exposed to the outside.

8. The lamp of claim 7, wherein the terminal piece includes a second hooking surface formed to extend from an end portion of the second body surface and be bent downward to be inserted into a second hooking groove formed in the terminal mounting part.

9. The lamp of claim 7, wherein the terminal mounting part includes:
- a first mounting surface in contact with an end of the guide surface; and
- a second mounting surface formed to extend from a lower end of the first mounting surface, and obliquely formed such that a thickness of the terminal mounting part increases in a downward direction.

10. The lamp of claim 9, wherein the second hooking groove is disposed in a lower end of the second mounting surface.

11. The lamp of claim 9, wherein two terminal mounting parts identical to the terminal mounting part are disposed in parallel.

12. The lamp of claim 11, wherein exposure directions of contact surfaces, which are identical to the contact surface, of the two terminal mounting parts are different.

13. The lamp of claim 12, wherein the exposure directions of the contact surfaces of the two terminal mounting parts are opposite each other.

14. The lamp of claim 3, wherein the terminal part includes two terminal pieces identical to the terminal piece coupled to the second substrate such that directions of contact surfaces identical to the contact surface are opposite each other.

15. The lamp of claim 1, wherein the lens includes a hook.

16. The lamp of claim 15, wherein at least two hooks identical to the hook are symmetrically disposed with respect to a center of the lens.

17. The lamp of claim 15, wherein the hook is inserted into a hook groove formed in the housing.

18. A lamp assembly for a vehicle, comprising:
a bracket; and
a lamp coupled to the bracket,
wherein the lamp comprises:
- a housing in which an open surface is formed;
- a first substrate and a second substrate that are electrically connected;
- a light source mounted and disposed in the housing such that the light source faces the open surface;
- a terminal part coupled to an end portion of the second substrate to be in contact with a terminal of a socket connected to an external power source, and a lens coupled to the housing to cover the open surface,
wherein the first substrate includes slots for electrical connection and the second substrate includes fins for electrical connection,
wherein the second substrate is electrically connected to the first substrate and perpendicularly coupled to the first substrate as the slots are connected to the fins, wherein the slots for electrical connection are disposed on an outer edge of the first substrate, wherein the terminal part includes a contact surface in contact with the terminal of the socket, and wherein the housing includes a terminal mounting part disposed on a lower end portion thereof, and into which the terminal part is inserted such that the contact surface is exposed to the outside.

19. The lamp assembly of claim 18, wherein a coupling hole through which the housing is coupled is formed in the bracket.

20. The lamp assembly of claim 18, wherein the terminal part includes:
- guide surfaces that extend downward from both side surfaces of the contact surface; and
- a terminal piece having a body surface that extends from the contact surface, wherein the body surface is disposed on a flat surface which is different from the contact surface, wherein the body surface and the contact surface are connected by an inclined connecting surface, wherein the body surface includes:
- a first body surface that extends from a rear surface of the contact surface; and
- a second body surface that extends from a front surface of the contact surface, and wherein the terminal part includes a first hooking surface disposed to extend from an end portion of the first body surface and be bent downward to be inserted into a first hooking groove disposed in an end portion of the second substrate.

* * * * *